(12) United States Patent
Petti et al.

(10) Patent No.: US 7,759,201 B2
(45) Date of Patent: Jul. 20, 2010

(54) METHOD FOR FABRICATING PITCH-DOUBLING PILLAR STRUCTURES

(75) Inventors: Christopher J. Petti, Mountain View, CA (US); Steven J. Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 155 days.

(21) Appl. No.: 12/000,758

(22) Filed: Dec. 17, 2007

(65) Prior Publication Data

US 2009/0155962 A1 Jun. 18, 2009

(51) Int. Cl.
*H01L 21/8234* (2006.01)
(52) U.S. Cl. .................. 438/275; 438/128; 438/129; 438/130; 438/278; 438/290; 438/283; 438/268; 438/257; 438/589; 257/E21.606
(58) Field of Classification Search ......... 438/128–130, 438/275, 278, 290, 283, 268, 257, 270, 271, 438/589; 257/E21.606
See application file for complete search history.

(56) References Cited

U.S. PATENT DOCUMENTS

| | | | |
|---|---|---|---|
| 4,151,602 A | 4/1979 | Haisma et al. | |
| 4,201,800 A | 5/1980 | Alcorn et al. | |
| 4,646,266 A | 2/1987 | Ovshinsky et al. | |
| 5,024,971 A | 6/1991 | Baker et al. | |
| 5,482,885 A | 1/1996 | Lur et al. | |
| 5,667,940 A | 9/1997 | Hsue et al. | |
| 5,739,068 A * | 4/1998 | Jost et al. ............... | 438/637 |
| 5,751,012 A | 5/1998 | Wolstenholme et al. | |
| 5,835,396 A | 11/1998 | Zhang | |
| 5,915,167 A | 6/1999 | Leedy | |
| 5,977,638 A | 11/1999 | Rodgers et al. | |
| 5,998,287 A | 12/1999 | Huang | |
| 6,034,882 A | 3/2000 | Johnson et al. | |
| 6,055,180 A | 4/2000 | Gudesen et al. | |
| 6,096,659 A | 8/2000 | Gardner et al. | |
| 6,140,234 A | 10/2000 | Uzoh et al. | |
| 6,185,122 B1 | 2/2001 | Johnson et al. | |
| 6,221,562 B1 | 4/2001 | Boyd et al. | |

(Continued)

FOREIGN PATENT DOCUMENTS

EP 0 288 739 A2 11/1988

(Continued)

OTHER PUBLICATIONS

U.S. Appl. No. 09/560,626, filed Apr. 28, 2000, Knall.

(Continued)

*Primary Examiner*—Davienne Monbleau
*Assistant Examiner*—Hajar Kolahdouzan
(74) *Attorney, Agent, or Firm*—Foley & Lardner LLP

(57) ABSTRACT

A method of making a semiconductor device includes forming at least one device layer over a substrate, forming at least two spaced apart features over the at least one device layer, forming sidewall spacers on the at least two features, filling a space between a first sidewall spacer on a first feature and a second sidewall spacer on a second feature with a filler feature, selectively removing the sidewall spacers to leave the first feature, the filler feature and the second feature spaced apart from each other, and etching the at least one device layer using the first feature, the filler feature and the second feature as a mask.

9 Claims, 10 Drawing Sheets

U.S. PATENT DOCUMENTS

| | | |
|---|---|---|
| 6,420,215 B1 | 7/2002 | Knall et al. |
| 6,420,231 B1 | 7/2002 | Harari et al. |
| 6,492,075 B1 | 12/2002 | Templeton et al. |
| 6,496,401 B2 | 12/2002 | Weis |
| 6,618,295 B2 | 9/2003 | Scheuerlein |
| 6,631,085 B2 | 10/2003 | Kleveland et al. |
| 6,855,614 B2 | 2/2005 | Metzler |
| 6,856,572 B2 | 2/2005 | Scheuerlein et al. |
| 6,879,505 B2 | 4/2005 | Scheuerlein |
| 6,951,780 B1 | 10/2005 | Herner |
| 6,952,030 B2 | 10/2005 | Herner et al. |
| 7,078,348 B1 | 7/2006 | Singh et al. |
| 7,081,377 B2 | 7/2006 | Cleeves |
| 7,176,064 B2 | 2/2007 | Herner |
| 7,177,169 B2 | 2/2007 | Scheuerlein |
| 7,211,866 B2 | 5/2007 | Yuan et al |
| 7,271,057 B2 * | 9/2007 | Eppich ............... 438/243 |
| 7,307,013 B2 | 12/2007 | Raghuram et al. |
| 7,514,204 B2 | 4/2009 | Hatakeyama et al. |
| 2002/0052068 A1 | 5/2002 | Juengling |
| 2002/0072208 A1 | 6/2002 | Gonzalez et al. |
| 2002/0172901 A1 | 11/2002 | Tokushima |
| 2003/0122156 A1 | 7/2003 | Maimon |
| 2003/0157436 A1 | 8/2003 | Manger et al. |
| 2003/0178684 A1* | 9/2003 | Nakamura ............ 257/368 |
| 2004/0241993 A1 | 12/2004 | Lin |
| 2004/0245557 A1 | 12/2004 | Seo et al. |
| 2005/0014385 A1 | 1/2005 | Ghozeil et al. |
| 2005/0052915 A1 | 3/2005 | Herner et al. |
| 2005/0112812 A1 | 5/2005 | Jang |
| 2005/0170294 A1 | 8/2005 | Kobayashi |
| 2005/0196684 A1 | 9/2005 | Nakamura et al. |
| 2005/0226067 A1* | 10/2005 | Herner et al. ............ 365/201 |
| 2005/0269553 A1 | 12/2005 | Sen et al. |
| 2006/0035167 A1 | 2/2006 | Angelopoulos et al. |
| 2006/0105476 A1 | 5/2006 | Choi et al. |
| 2006/0154182 A1 | 7/2006 | Brodsky |
| 2006/0177977 A1 | 8/2006 | Chan et al. |
| 2006/0216937 A1 | 9/2006 | Dunton et al. |
| 2006/0250836 A1* | 11/2006 | Herner et al. ............ 365/148 |
| 2006/0250837 A1 | 11/2006 | Herner et al. |
| 2006/0273298 A1 | 12/2006 | Petti |
| 2007/0049035 A1 | 3/2007 | Tran |
| 2007/0059914 A1 | 3/2007 | Jung et al. |
| 2007/0099431 A1 | 5/2007 | Li |
| 2007/0114508 A1 | 5/2007 | Herner et al. |
| 2007/0114509 A1 | 5/2007 | Herner |
| 2007/0158688 A1* | 7/2007 | Caspary et al. ............ 257/208 |
| 2007/0176160 A1* | 8/2007 | Uchiyama et al. ............ 257/10 |
| 2007/0197014 A1 | 8/2007 | Jeon et al. |
| 2007/0212889 A1 | 9/2007 | Abatchev et al. |
| 2007/0269746 A1 | 11/2007 | Nakamura |
| 2007/0284656 A1 | 12/2007 | Radigan et al. |
| 2008/0013364 A1 | 1/2008 | Kumar et al. |
| 2008/0014533 A1 | 1/2008 | Keller et al. |
| 2008/0085600 A1 | 4/2008 | Furukawa et al. |
| 2008/0128867 A1 | 6/2008 | Lee |
| 2008/0241736 A1 | 10/2008 | Kobayashi et al. |
| 2008/0248654 A1 | 10/2008 | Jung |
| 2009/0149026 A1 | 6/2009 | Zhou et al. |
| 2009/0321789 A1 | 12/2009 | Wang et al. |

FOREIGN PATENT DOCUMENTS

| | | |
|---|---|---|
| EP | 1 746 645 A2 | 1/2007 |
| EP | 1 818 977 A2 | 8/2007 |
| GB | 1 476 585 | 6/1977 |
| JP | 2008-83537 | 4/2008 |
| KR | 2007-0122049 | 12/2007 |
| WO | WO 2004/061851 A2 | 7/2004 |
| WO | WO 2007/103343 A1 | 9/2007 |
| WO | WO 2008/114644 A1 | 9/2008 |

OTHER PUBLICATIONS

U.S. Appl. No. 11/864,205, filed Sep. 28, 2007, Chen.
U.S. Appl. No. 12/149,151, filed Apr. 28, 2008, Yung-Tin Chen et al.
Office Action mailed Jul. 28, 2009 in U.S. Appl. No. 12/149,151.
International Search Report and Written Opinion mailed Sep. 7, 2009, received in International Application No. PCT/US2009/002400 (16 pgs.).
U.S. Appl. No. 12/005,276, filed Dec. 27, 2007, Roy E. Scheuerlein et al.
U.S. Appl. No. 12/005,346, filed Dec. 27, 2007, Roy E. Scheuerlen et al.
International Search Report and Written Opinion mailed Oct. 9, 2009, received in International Application No. PCT/US2009/048581.
Invitation to Pay Additional Fees, including partial International Search Report mailed Oct. 21, 2009, received in International Application No. PCT/US2009/048584.
Office Action mailed Jul. 8, 2009, received in U.S. Appl. No. 12/216,107.
International Search Report and Written Opinion mailed Jun. 8, 2009, received in International Application No. PCT/US2009/039121.
International Search Report and Written Opinion mailed Jun. 8, 2009, received in International Application No. PCT/US2009/039124.
Office Action mailed Mar. 30, 2009, received in U.S. Appl. No. 11/864,205.
Office Action mailed Jan. 28, 2010, received in U.S. Appl. No. 12/216,109.
International Search Report and Written Opinion mailed Mar. 4, 2010, received in International Application No. PCT/US2009/059188.
Black et al., Polymer Self Assembly in Semiconductor Microelectronics, IBM J. Res. & Dev., Sep. 2007, pp. 605-633, vol. 51, No. 5.
Ishibashi, Takeo et al., "Advanced Micro-Lithography Process for i-line Lithography," Jpn. J. Appl. Phys. vol. 40, Part 1, No. 12, 2001, pp. 7156-7161.
Naji, Peter J. et al., "A 256kb 3.0V 1T1MTJ Nonvolatile Magnetoresitive RAM", Digest of of Technical Papers of the 2001 IEEE International Solid-State Circuits Conference, ISSCC 2001/Session 7/Technology Directions: Advanced Technologies/7.6, Feb. 6, 2001, 3 pgs.

* cited by examiner

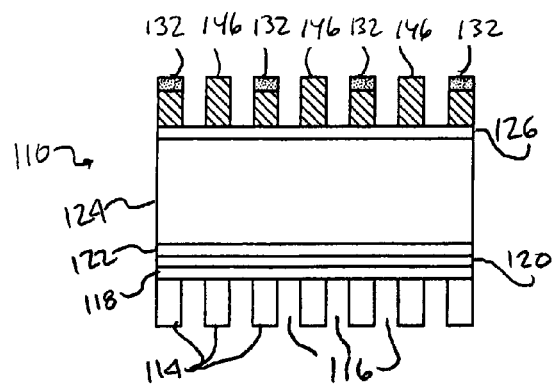
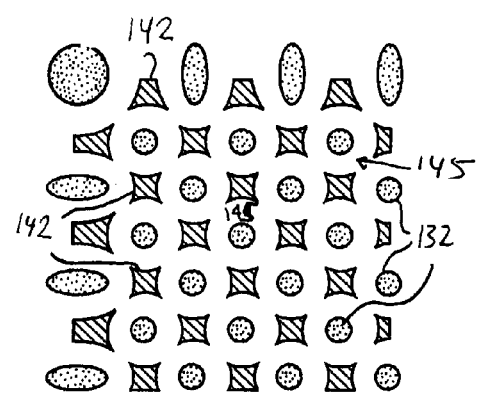
FIG - 9A  FIG - 9B
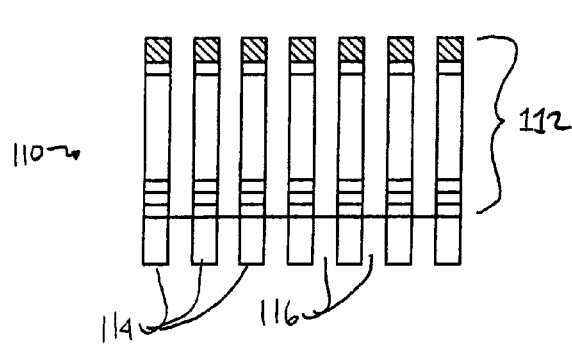
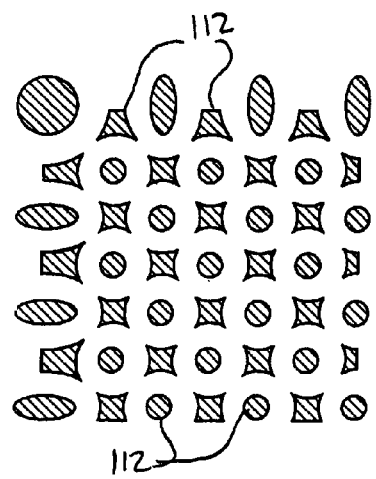
FIG - 10A  FIG - 10B

METHOD FOR FABRICATING PITCH-DOUBLING PILLAR STRUCTURES

BACKGROUND

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost and thus is a primary motivation in the designing of such circuits.

As the dimensions for structures formed on a semiconductor wafer diminish, tools currently available to create these devices reach their limits. By way of example, currently available 193 nanometer immersion tools will fail to create structures with a pitch of less than about 80 nm. To fabricate features smaller than this with the currently available tools, one must use more complicated processes. One such process is the technique of double exposure/double patterning. Another is the use of sidewall spacers, formed on a template pattern which is then removed. The sidewall spacers are then used as mask during etching of the underlying film or films.

For simple, one-dimensional, regular line-and-space patterns, both of these techniques have the effect of dividing the photolithographically-produced pitch by two. In this way, the resolution capability of a given photolithography tool can be extended.

However, for a two-dimensional pattern of regularly-spaced pillars, the double-patterning scheme extends the pitch by a factor of the square root of 2. The sidewall spacer method, as-is, cannot be used at all since such a scheme would produce regularly spaced cylindrical annuli, rather than solid pillars.

SUMMARY

A method of making a semiconductor device includes forming at least one device layer over a substrate, forming at least two spaced apart features over the at least one device layer, forming sidewall spacers on the at least two features, filling a space between a first sidewall spacer on a first feature and a second sidewall spacer on a second feature with a filler feature, selectively removing the sidewall spacers to leave the first feature, the filler feature and the second feature spaced apart from each other, and etching the at least one device layer using the first feature, the filler feature and the second feature as a mask.

BRIEF DESCRIPTION OF THE DRAWINGS

FIGS. 6 through 10 are cross-sectional side views (Figures with subpart a) and top views (Figures with subpart b) of process steps of making a device array according to one embodiment of the invention.

DETAILED DESCRIPTION OF THE EMBODIMENTS

Figure 1:
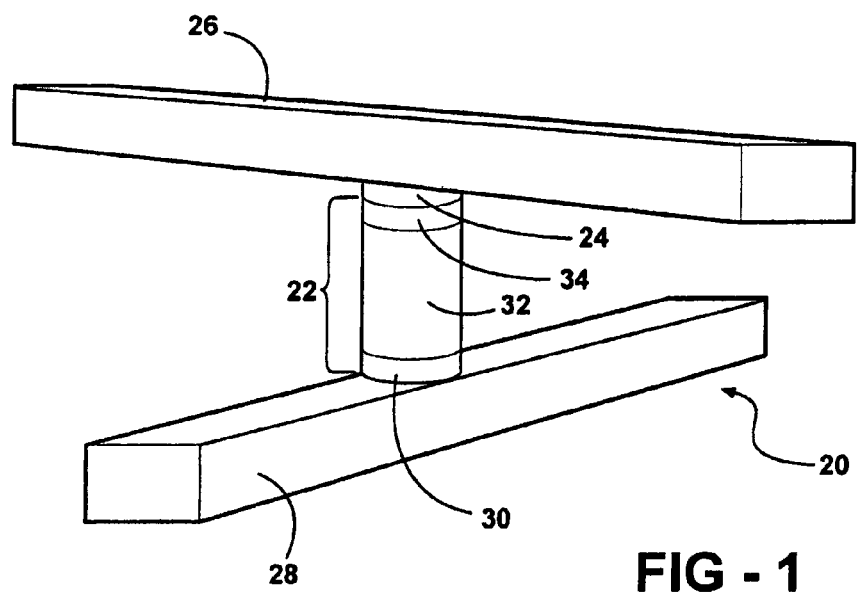
FIG. 1 is a perspective view of a nonvolatile memory cell.

The present inventors realized that instead of using sidewall spacers as mask for etching device layers, the sidewall spacers may instead be used as sacrificial spacers when forming the etching mask. Once the etching mask is formed, the sidewall spacers are removed and portions of the device layers located below the former sidewall spacer locations are removed to leave spaced apart devices, such as pillar shaped devices.

For example, one or more device layers are first formed over a substrate. Any suitable substrate may be used, such as a semiconductor wafer (including silicon or compound semiconductor wafers) or a metal, glass, ceramic or plastic substrate. The substrate may be covered by one or more insulating layers and/or one or more devices, such as driver circuits, may be formed on or in the substrate. The device layers may comprise semiconductor layers for semiconductor devices, electrically conductive layer or layers which form electrodes, and/or insulating layers for isolation of the semiconductor or conductive portions of the devices.

At least two spaced apart features are then formed over the device layers. Preferably, a plurality (i.e., more than two) features are formed to form a large device array. The features may be formed directly on or above semiconductor, conductive and/or insulating device layers. The features may have any shape and may be made of any material as long as these features can subsequently function as an etching mask for etching the underlying device layers.

For example, as will be described in more detail below, the features may have a cylindrical shape. However, other shapes, such as rectangular or triangular shape may also be used if rectangular or triangular devices are to be formed. The features may have any desired size, and preferably have the same width as the desired width of the underlying devices. The features should have a sufficient height or thickness to act as an etching mask. The features may comprise an electrically conductive material, such as tungsten, and may optionally be covered by a silicon nitride, titanium nitride or other hard mask material. Other materials may also be used. Alternatively, the features may comprise an insulating material, such as silicon oxide or silicon nitride, or a semiconductor material, such as polysilicon.

Sidewall spacers are then formed on the features. Sidewall spacers may be formed by conventional sidewall spacer formation methods, such as by depositing a film over the features and then anisotropically etching the film to leave sidewall spacers on the features. The spacers may be made of a conductive, insulating or semiconductor material different from that of the upper portions of the features. The sidewall spacer material can be selected i) such that it can be selectively anisotropically etched with dry etch chemistry compared to the material in at least the upper portions of the features; and ii) such that it can be selectively removed (such as isotropically etched) compared to the material in at least the upper portions of the features using a different dry or wet etch chemistry. For example, when the features comprise tungsten and a nitride hard mask, the spacers may be formed from silicon oxide. When the features comprise silicon oxide, the spacers may be formed from a nitride, such as silicon nitride. Other material combinations may also be used.

Subsequently, the spaces between adjacent spacers located on adjacent features are filled with so-called filler features. The filler features may be formed by forming a filler film or layer over and between the features and the sidewall spacers, followed by planarizing the filler film to expose upper portions of the features and upper portions of the sidewall spacers. The planarization can be carried out by chemical-mechanical polishing (CMP) or etchback. The CMP process can use the upper portions of the features as a polish stop. For example, a TiN hard mask on the features may be used as a polish stop. The filler film may comprise the same material as the features or it may comprise a material having similar etching characteristics as the features. The filler film material should be different from the material of the sidewall spacers so that the sidewall spacers can be selectively etched compared to the features and the filler features. For example, the filler film material may comprise tungsten when the features are also made of tungsten. Alternatively, the filler film material may comprise silicon oxide when the features are made of silicon oxide.

After the filler features are formed, the sidewall spacers are selectively removed. The removal may be performed by selective wet etching for example. The step of selectively removing comprises selectively etching the material of the sidewall spacers without substantially removing the original feature or filler feature material. The removal of the spacers leaves original features and the filler features spaced apart from each other.

The spaced apart original features and filler features then function as etching mask during the etching of the underlying device layers. The device layers may be etched using isotropic or anisotropic etching using the original features and the filler features as a mask. The original features and/or filler features may be retained in a completed device or removed after etching the device layers. For example, the conductive features and filler features may be retained as portions of upper electrodes.

Any suitable devices may be formed. The devices may have a substantially cylindrical and/or substantially rectangular pillar shape, depending on the shape of the features and the filler features, as will be described in more detail below. Non-pillar shaped devices may also be formed. The devices may comprise diodes, transistors, resistors, antifuse dielectrics, fuses, resistivity-switching materials, capacitors, etc. Logic, volatile memory or nonvolatile memory devices or arrays may be formed.

In a preferred non-limiting embodiment, a plurality of pillar shaped devices which comprise a plurality of diode containing nonvolatile memory cells are formed. Referring to FIG. 1, U.S. Pat. No. 6,952,030, issued to Herner et al. and entitled "High-Density Three-Dimensional Memory Cell," hereinafter the "'030 patent" and hereby incorporated by reference, discloses an exemplary nonvolatile memory cell which can be formed by the method of the embodiments of the present invention.

The memory cell 20 includes a vertically oriented, cylindrical pillar shaped junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material.

The diode 22 and an optional antifuse dielectric 24 are interposed between top 26 and bottom 28 conductors or electrodes. The vertically oriented junction diode 22 includes a heavily doped semiconductor region 30 of a first conductivity type (such as n-type), an intermediate region 32 which is undoped semiconductor material or lightly doped semiconductor material (which will be referred to as an intrinsic region), and a heavily doped semiconductor region 34 of the second conductivity type (such as p-type) to form a p-i-n diode. If desired, the location of the p and n-type regions may be reversed. The semiconductor material of the junction diode 22 is generally silicon, germanium, or an alloy of silicon and/or germanium. Other semiconductor materials may also be used. The junction diode 22 and the antifuse dielectric 24 are arranged in series between the bottom conductor 28 and the top conductor 26, which may be formed of a metal, such as tungsten and/or TiN. The antifuse dielectric 24 may be located above or below the diode 22.

The memory cell may comprise a one-time programmable (OTP) or re-writable nonvolatile memory cell. For example, each diode 22 may act as a steering element of a memory cell and another material or layer 24 which acts as a resistivity switching material (i.e., which stores the data) is provided in series with the diode between the conductors. Specifically, instead of the antifuse dielectric, the resistivity switching material 24 may comprise a fuse, polysilicon memory effect material, metal oxide (such as nickel oxide, perovskite materials, etc,), carbon nanotubes, phase change materials, switchable complex metal oxides, conductive bridge elements, or switchable polymers. The resistivity of the resistivity switching material 24 may be increased or decreased in response to a forward and/or reverse bias provided between the electrodes or conductors.

Briefly, the cell 20 operates as follows. In the initial state, very little current flows through the junction diode 22 when a read voltage is applied between the top conductor 26 and the bottom conductor 28 because the antifuse dielectric 24 impedes current flow. The application of a programming voltage between the top conductor 26 and bottom conductor 28 causes dielectric breakdown of the antifuse material, permanently forming a conductive path through the antifuse 24. If the diode semiconductor material is initially formed in a high resistivity state, then the semiconductor material of diode 22 may be altered as well, changing it to a lower-resistivity state. After programming, a higher read current flows between the top conductor 26 and the bottom conductor 28 upon application of a read voltage. In this way, a programmed cell can be distinguished from an unprogrammed cell.

In alternative embodiments, the antifuse dielectric 24 may be omitted. Instead, the polycrystalline semiconductor material of diode 22 is formed in a relatively high-resistivity state, which also tends to impede current flow, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage lowers the resistivity state of the diode. Thus, the diode acts as a resistivity switching material in this embodiment.

Figure 2:
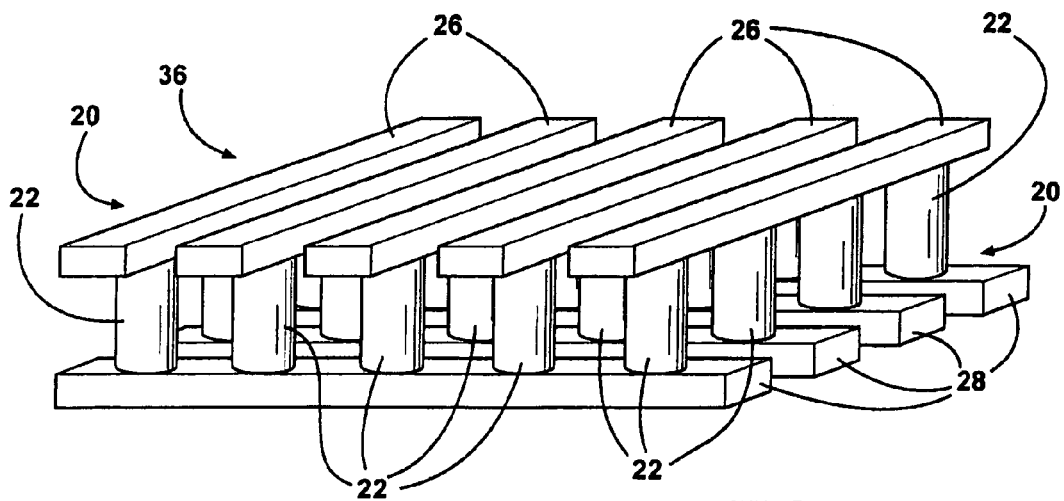
FIG. 2 is a perspective view of an array of memory cells of FIG. 1.

Referring to FIG. 2, a portion of a first memory level 36 of memory cells 20 similar to the cell 20 of FIG. 1 is shown. Two, three, four, or more such memory levels, such as eight levels may be formed, stacked one atop the other, to form a monolithic three dimensional memory array, preferably formed above a substrate such as a monocrystalline silicon wafer, and described in the '030 patent and the '549 and '530 applications. The diode pillars 22 preferably have a pitch of less than 100 nm, such as pitch of 78 nm or less and a diameter of 100 nm or less, such as 50 nm or less, such as 32 nm for example.

The bottom electrodes or conductors 28 can be formed either by subtractive or by Damascene methods. In a subtractive method, a conductive layer or film is patterned into spaced apart electrodes and the gaps between the electrodes are then filled with an insulating material. In a Damascene method, grooves are formed in an insulating material, a conductive layer or film is formed in the grooves and over the insulating layer, and then the conductive layer or film is planarized to leave spaced apart electrodes in the grooves.

Figure 3A:
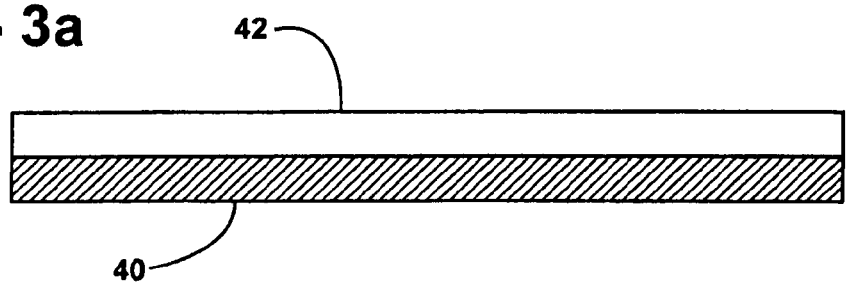
FIGS. 3a through 3d are cross-sectional side views illustrating steps in the process of forming conductive rails by a subtractive method.
Figure 3B:
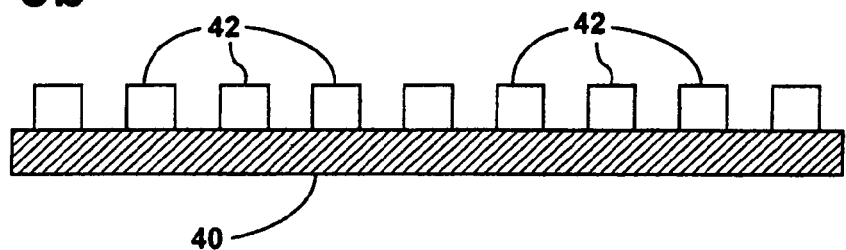
Figure 3C:
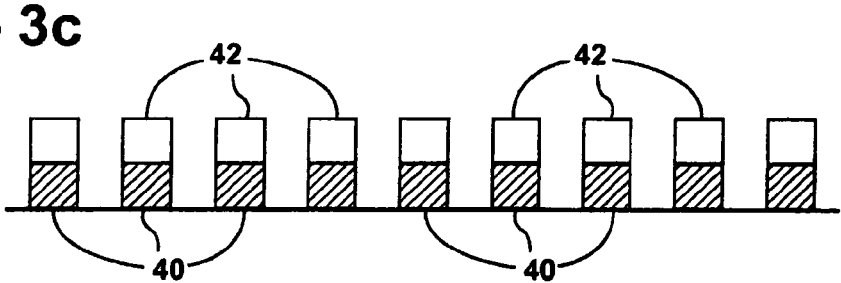
Figure 3D:
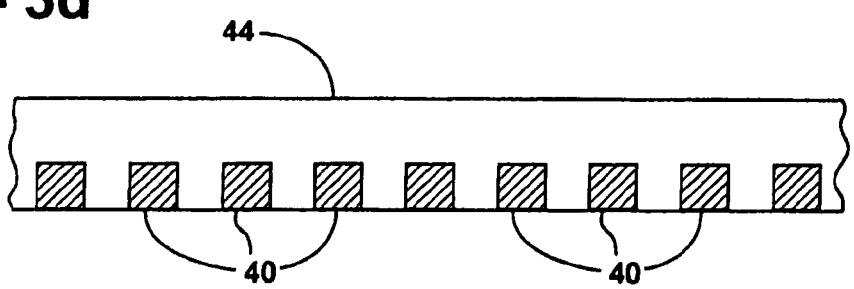

FIGS. 3a-3d illustrate the subtractive method of forming rail-shaped electrodes or conductors 28. As shown in FIG. 3a, one or more conductive layers 40, such as a W and/or a TiN layers are deposited over a substrate, and a layer of photoresist 42 is spun onto it. As shown in FIG. 3b, the layer of photoresist 42 is then photolithographically patterned into the desired form. As shown in FIG. 3c, an etch step removes portions of the conductive layer(s) 40 where they are not protected by etched photoresist layer 42. As shown in FIG. 3d, after the etch, the photoresist layer 42 is stripped, leaving conductor or electrode rails 40 behind. The gaps between the rails 40 are filled with an insulating material 44, such as silicon oxide, silicon nitride or other insulating materials. If desired, any overfill of the insulating material 44 can be removed, for example by chemical-mechanical polishing (CMP), to expose the upper surface of the rails 40 in the planarized surface of the insulating layer 44.

Figure 4A:
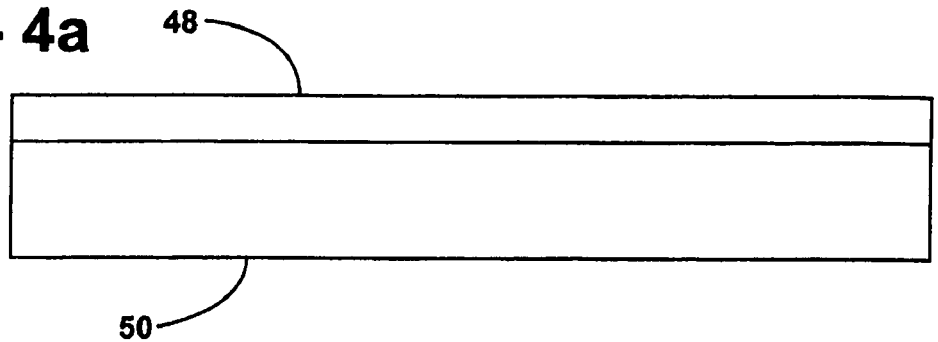
FIGS. 4a through 4d are cross-sectional side views illustrating steps in the process of forming conductive rails by a Damascene method.
Figure 4B:
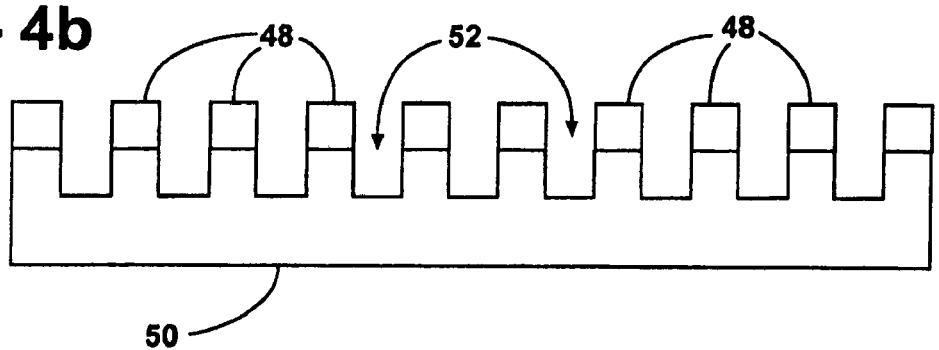
Figure 4C:
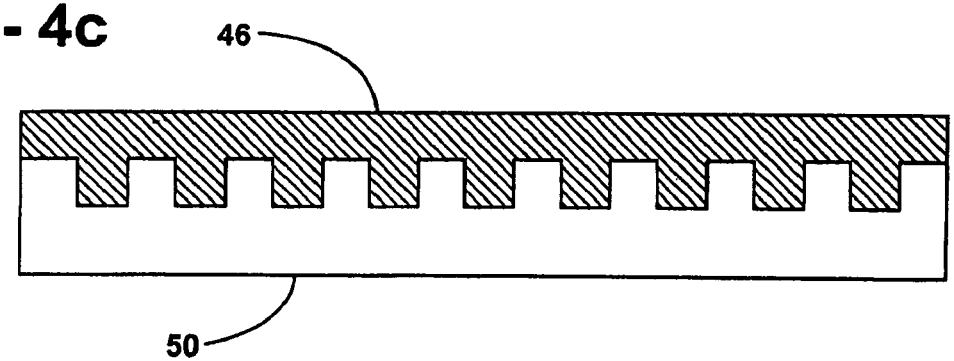
Figure 4D:
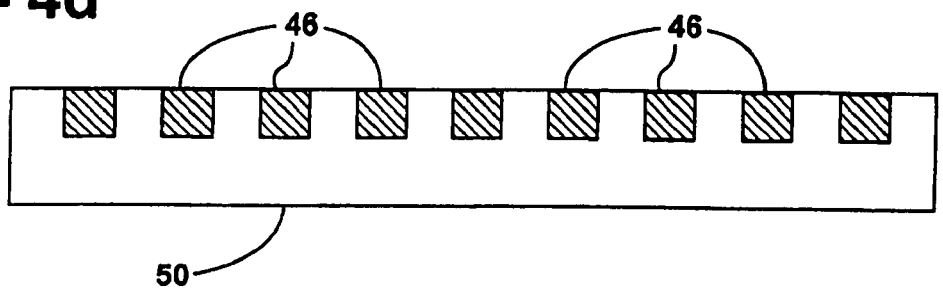

FIGS. 4a to 4d illustrate the Damascene method to form the electrode or conductor 28. First, a layer of photoresist 48 is spun onto a deposited insulating layer 50, such as a silicon oxide layer. As shown in FIG. 4b, the layer of photoresist 48 is patterned. An etch step then forms grooves or trenches 52 in the insulating layer 50. In FIG. 4c, after removal of the photoresist layer 48, one or more conductive layers 46, such as a W and/or TiN layers are deposited to fill the grooves or trenches 52. The one or more conductive layers 46 are planarized, for example by CMP or etchback, with the upper surface of the insulating layer to leave the rail shaped conductors in the grooves, as shown in FIG. 4d.

Figure 5:
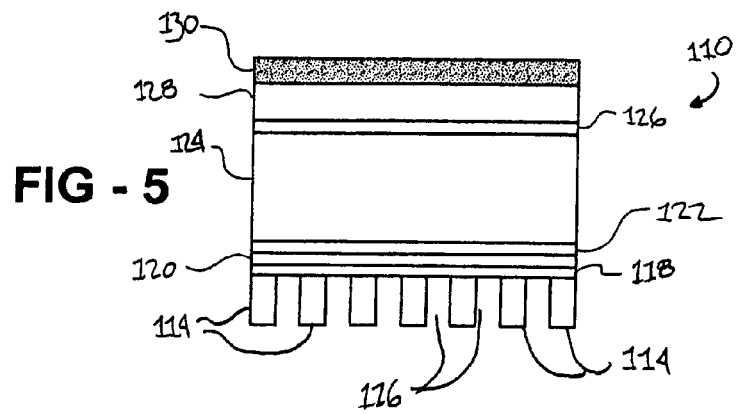
FIG. 5 is a cross-sectional side view of the device layers prior to the formation of the pillar structures.

FIG. 5 shows an initial stage of fabrication of a semiconductor device, such as a pillar shaped nonvolatile memory cell array 110, according to one embodiment of the invention. The array 110 contains a plurality of bottom electrodes 114 formed by the subtractive or Damascene methods described above with respect to FIG. 3 or 4 respectively. The electrodes 114 correspond to the rail shaped conductors 28 shown in FIGS. 1 and 2. The electrodes 114 may comprise any suitable conductive material, such as tungsten, aluminum, their alloys, etc. The electrodes 114 are separated from each other by an insulating material 116, such as silicon oxide. An optional adhesion layer 118 is formed above the electrodes 114. The adhesion layer may comprise titanium nitride or tungsten nitride. The optional antifuse dielectric layer 120 is deposited over the adhesion layer 118. The antifuse dielectric layer 120 may comprise a thin silicon oxide or other insulating layer. Alternatively, another resistivity switching material described above may be substituted from the antifuse dielectric layer. Another optional adhesion layer 122, such a TiN layer, is deposited over the antifuse dielectric layer 120. Therefore, the dielectric layer 120 is sandwiched between two adhesion layers 118, 122.

One or more semiconductor layers 124, such as silicon or germanium or their alloys are formed over the adhesion layer 122. For example, the semiconductor layers 124 may comprise a lower n-type layer, a middle intrinsic layer and an upper p-type layer. The p-type layer may be formed by ion implantation of p-type dopants into the upper part of the intrinsic layer or by deposition of a p-type doped semiconductor layer on the intrinsic layer. An optional upper adhesion layer 126, such as a TiN layer, is formed over the semiconductor layers 124. A conductive layer 128, such as a W layer, is formed over the adhesion layer 126. Finally, hard mask or polish stop 130, such as a TiN or silicon nitride hard mask or polish stop layer is formed on the conductive layer 128.

Figure 6A:
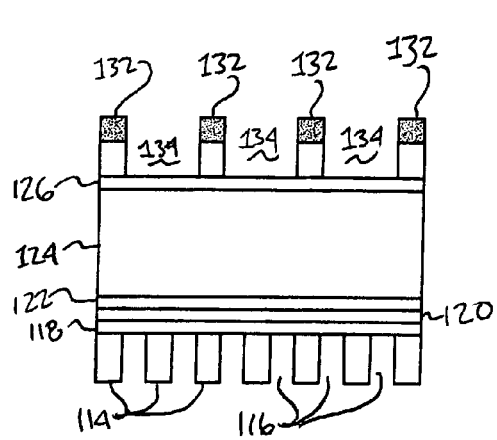
Figure 6B:
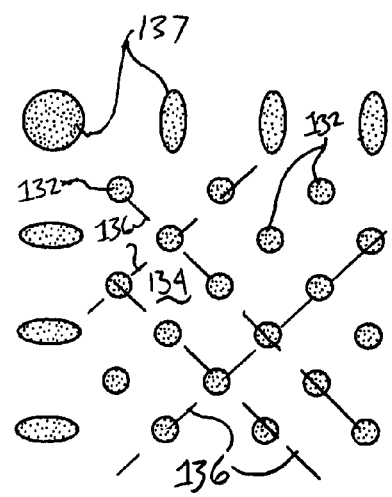

Referring to FIGS. 6a and 6b, a first step in the process of creating the pillar devices is shown. FIG. 6a represents a side cross-sectional view of the device layers and FIG. 6b represents a top view of the same after the first step. In the first step, a photoresist layer is formed on the hard mask 130. The photoresist layer is exposed and patterned. The photoresist pattern is then used as a mask to etch the hard mask 130 and conductive layer 128 into a plurality of features 132. The features are spaced apart from each other by spaces 134 (in the horizontal and vertical directions as shown in FIG. 6b).

The features 132 are preferably arranged along a plurality of imaginary diagonal lines 136 in a rhombus or rotated square type pattern, as shown in FIG. 6b. Only four of the plurality of diagonal lines 136 are shown in FIG. 6b for clarity. As shown in FIG. 6b, the features 132 preferably have a substantially cylindrical shape (i.e., they have a circular or near circular (such as oval) cross section).

Alignment edge features 137 are provided adjacent to the device array boundary, as shown in FIG. 6b. The alignment edge features may have a larger size than the plurality of spaced apart features 132 and/or they may have a different shape, such as an oval cross sectional shape. The alignment edge features will be used to simplify alignment in the cut mask step that will be described below.

Figure 7A:
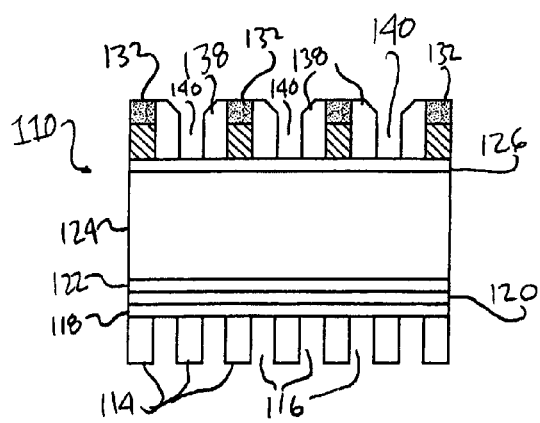
Figure 7B:
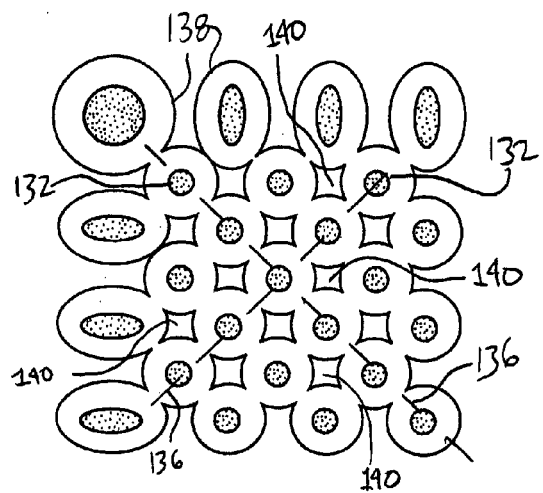

FIGS. 7a and 7b show the next process step. In this step, silicon oxide spacers 138 are formed on each feature 132. It should be noted that if each feature 132 is cylindrical, then it technically has only one sidewall and only one ring or annulus shaped spacer 138 is formed around the sidewall of the feature 132. However, as used herein, the term "spacers" will denote the single annular spacer 138 as well as two or more spacers 138 formed on discrete sidewalls of a polygonal feature 132. The spacers 138 are formed by depositing a silicon oxide layer or film over and between the features 132 followed by anisotropic etching of the silicon oxide layer or film.

The oxide spacers 138 fill the spaces 134 around the features 132 primarily along the plurality of diagonal lines 136, leaving discrete spaces or interstices 140 between adjacent sidewall spacers 138. Due to the annular shape of the sidewall spacers 138, the interstices have a rectangular cross sectional shape with concave sidewalls, as shown in FIG. 7b.

Figure 8A:
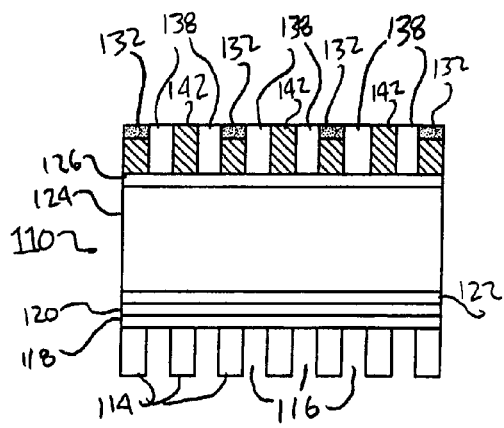
Figure 8B:
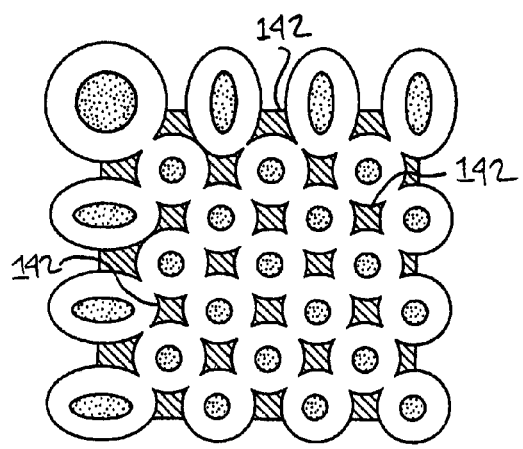

FIGS. 8a and 8b show the next two steps of the process. A tungsten filler material film or layer is formed between and over the features 132 and spacers 138. The tungsten filler film is then planarized by CMP or etchback to expose the upper surfaces of the features 132 (i.e., the TiN hard mask) and spacers 138. The planarization leaves a plurality of tungsten filler features 142 between the sidewall spacers 138. Since the filler features 142 fill the interstices 140, the filler features 142 also have a rectangular or square cross sectional shape with concave sidewalls (i.e., a substantially rectangular or square shape). At this point in the fabrication of the device array, the spaces 134 are completely filled with either oxide spacers 138 or filler features 142.

If desired, an optional cut masking and etching step is performed after the planarization of the filler film to remove the filler film or filler features 142 from the area outside of the device array. A photoresist layer is formed over the plurality of filler features 142 and over the plurality of spaced apart features 132. The photoresist layer is exposed such that the edges of the exposed areas intersect all of the edge features 137. Elongating or enlarging the edge features 137 thus allows for an easier alignment of this cut mask. The remaining filler film or filler features remaining in areas outside of the device array boundary that are not covered by the photoresist pattern are etched away. If desired, the cut masking and etching step can be performed prior to the planarization step.

FIGS. 9a and 9b show the next step in the process. In this step, the oxide spacers 138 are selectively etched away leaving the features 132 and filler features 142 spaced apart by spaces 145. The spacers 138 may be selectively etched by any selective wet or dry etch which can selectively etch silicon oxide over the TiN or silicon nitride of features 132 and over the tungsten of filler features 142. For example, an HF isotropic wet etch may be used. The pitch between the features 132 and the filler features 142 has doubled compared to the pitch between the features 132 alone due to the removal of the oxide spacers.

As shown in FIGS. 10a and 10b, the device layers 118, 120, 122 and 124 are etched using the features 132 and the filler features 142 as a mask to form a plurality of pillar shaped devices 112. For example, each of the devices comprises the p-i-n diode in series with an antifuse dielectric, as described with respect to FIG. 1. The pillar shaped devices 112 have a pitch which is double that of what the pitch would have been had only the features 132 been used as mask.

The spaces between the pillar devices 112 are filled with a gap fill insulating material, such as silicon oxide, to isolate the devices 112 from each other. The gap fill insulating material may be planarized by CMP or etchback.

The features 132 and filler features 142 may be either retained in the final device or removed after the formation of the pillar devices 112. For example, the conductive features 132 and filler features 142 may be retained in contact with the upper part of the devices 112. The upper conductors or electrodes 26 shown in FIG. 1 are then formed in contact with the features 132 and filler features 142. Alternatively, the features 132 and filler features 142 may be removed prior to formation of the upper conductors or electrodes 26. The upper conductors or electrodes 26 may be formed by the subtractive or the Damascene processes described above with respect to FIG. 3 or 4.

FIGS. 11a through 11h illustrate the steps in a process according to an alternative embodiment. This alternative embodiment avoids the second tungsten deposition step described above which was used to deposit the filler film. Instead, the features, filler features and sidewall spacers are formed from easy to deposit insulating materials. In FIGS. 11a to 11h, like numerals are offset by 100 from those in FIGS. 5 to 10.

In this alternative embodiment, all of the layers described in the embodiment of FIGS. 5 to 10 are the same except as otherwise noted. In the memory cell array 210 shown in FIG. 11a, layers 214, 218, 220, 222, 224, 226 and 228 are the same as layers 114, 118, 120, 122, 124, 126 and 128. An oxide layer 248, such as a silicon oxide layer, is formed over layer 228. Alternatively, layer 248 may comprise a metal oxide, such as aluminum oxide, etc.

Figure 11A:
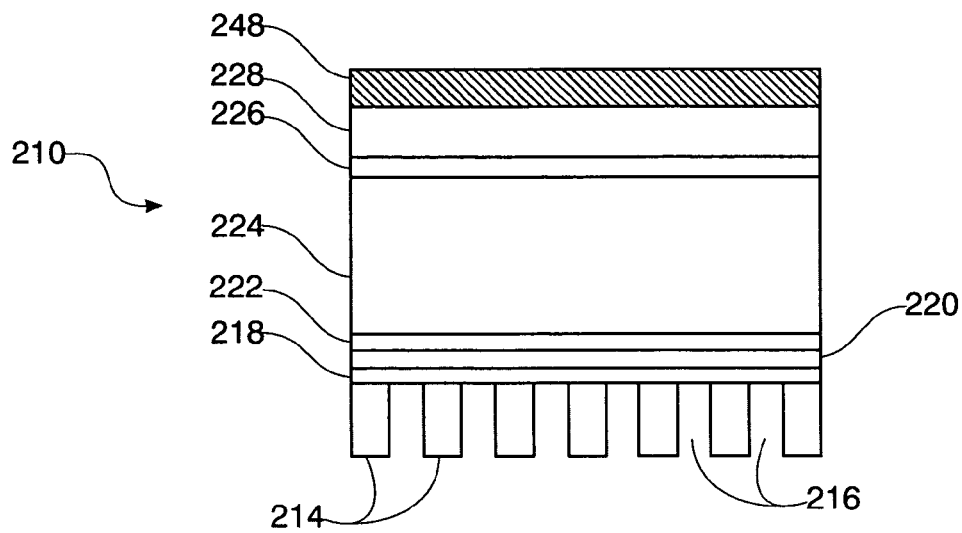
FIGS. 11a through 11h are cross-sectional side views of process steps of making a device array according to an alternative embodiment of the invention.
Figure 11B:
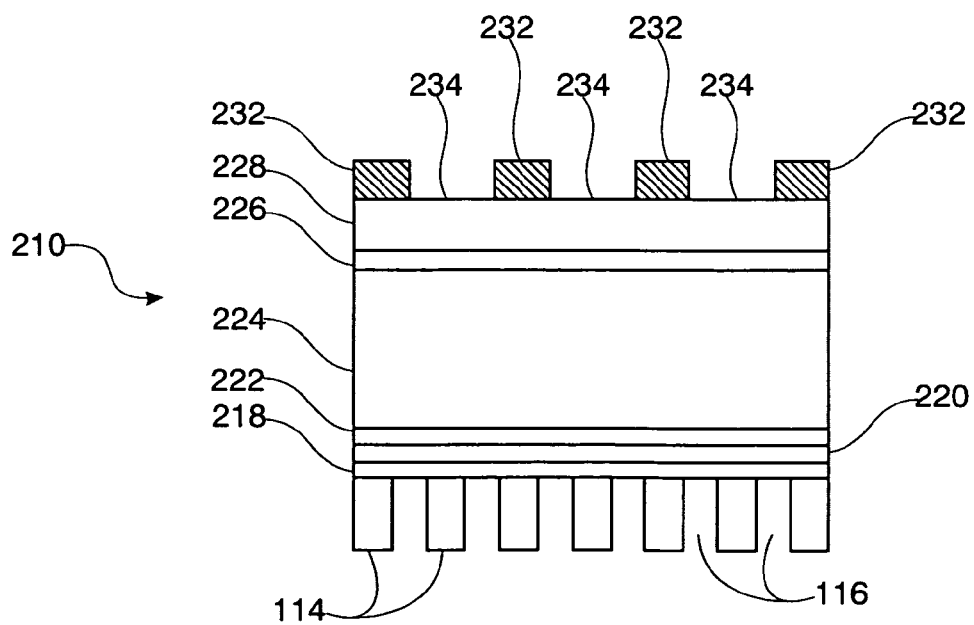
Figure 11C:
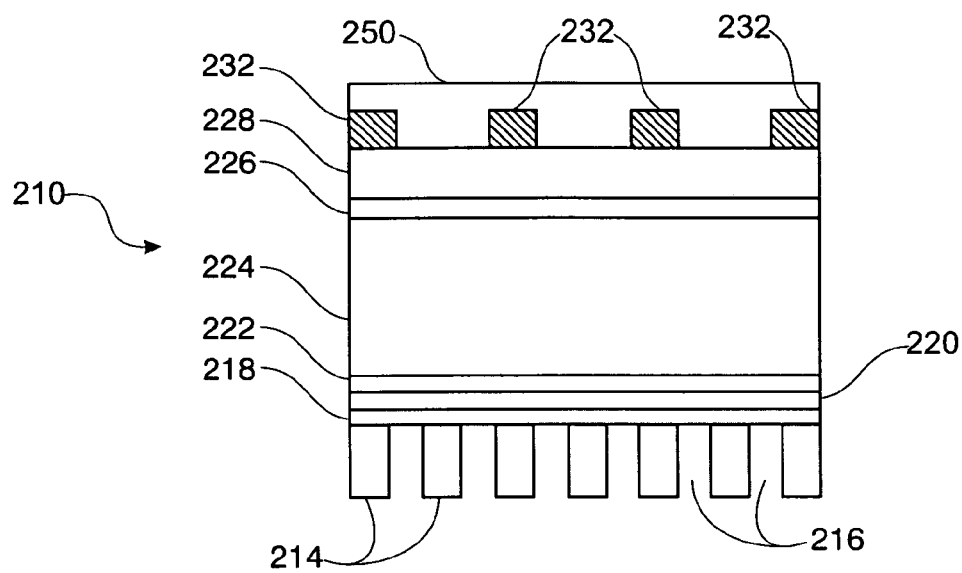
Figure 11D:
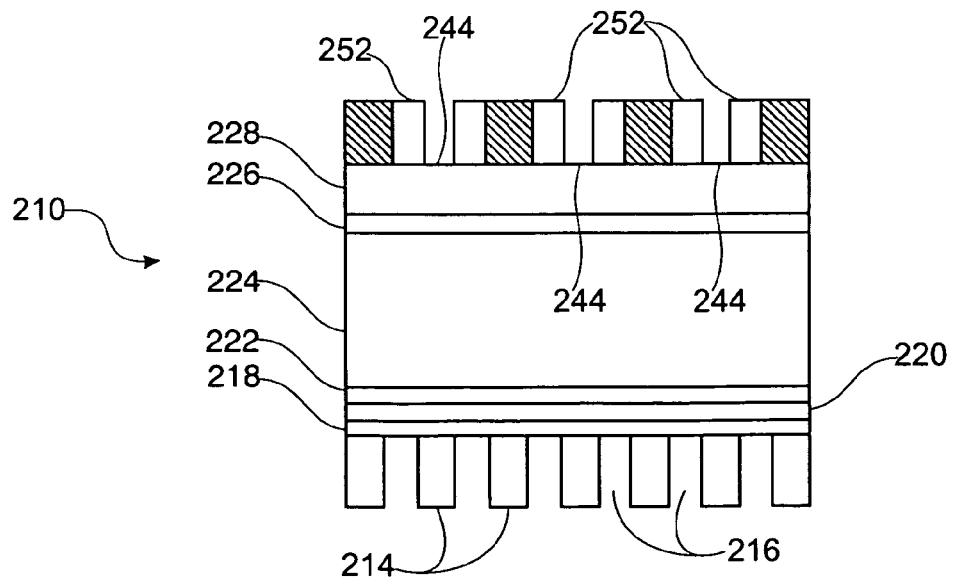

As shown in FIG. 11b, layer 248 is patterned to form oxide features 232 spaced apart by spaces 234. As shown in FIG. 11c, a nitride spacer layer 250, such as a silicon nitride spacer layer, is formed over the features 232. As shown in FIG. 11d, the nitride spacer layer 250 is anisotropically etched to form nitride spacers 252. The nitride spacers 252 define smaller spaces or interstices 244 between the nitride spacers 252.

Figure 11E:
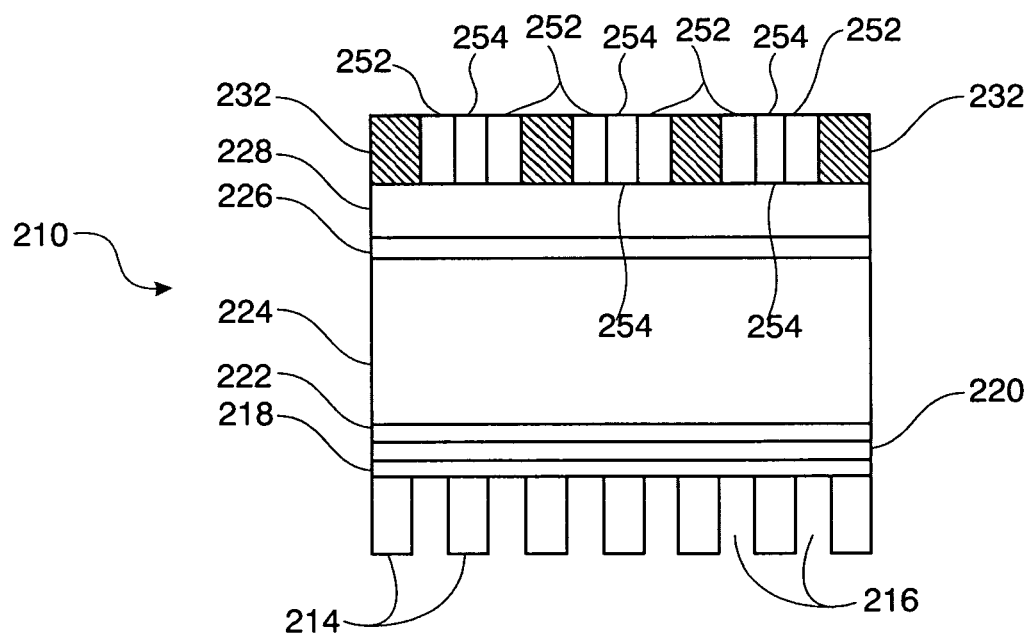

Referring to FIG. 11e, oxide filler features 254 fill the interstices 244 disposed between the nitride spacers 252. The oxide filler features 254 may be formed by depositing and planarizing an oxide layer to expose the features 232 and spacers 252. The filler features 254 do not have to completely fill the interstices 244. If the corners of the interstices are not filled in, then the filler features 254 have a more circular cross section. The cut masking and etching step can be optionally performed at this time to remove the oxide from outside the device array boundary.

Figure 11F:
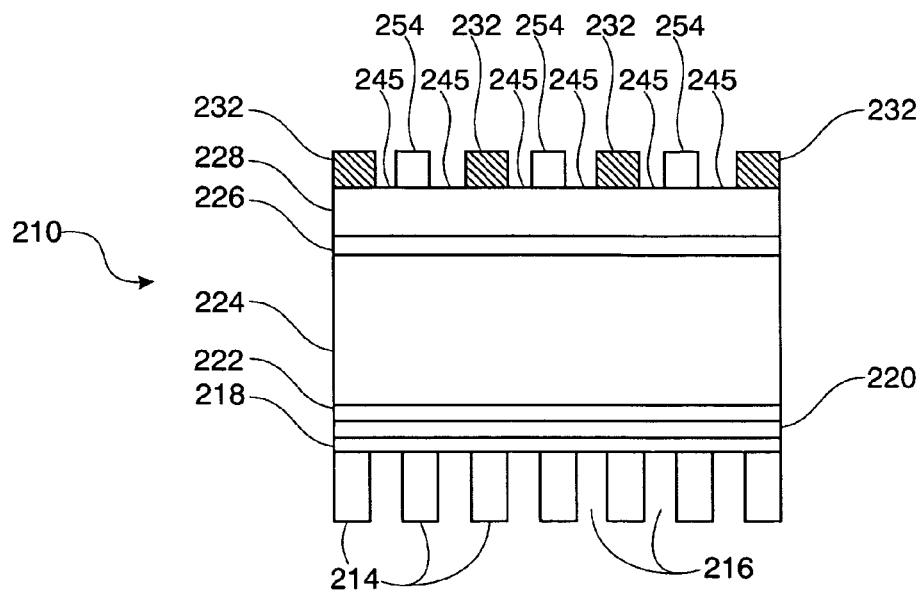
Figure 11G:
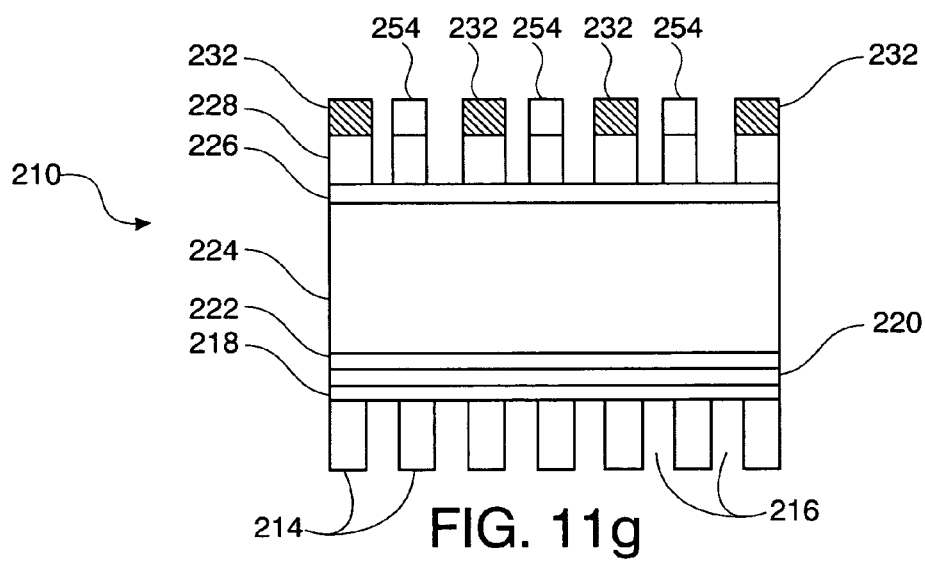
Figure 11H:
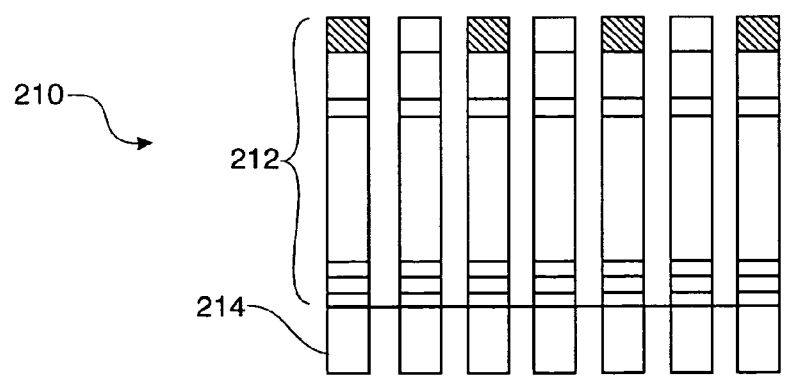

As shown in FIG. 11f, the nitride spacers 252 are selectively removed, such as by a wet hot phosphoric acid or an anisotropic dry selective etch to leave spaces 245. As shown in FIG. 11g, the tungsten layer 228 is etched using the oxide features 232 and filler features 254 as a mask. If desired, the oxide features 232 and filler features 254 may be removed after this step or retained during the next etching step. As shown in FIG. 11h, the rest of the device layers are etched to form the pillar shaped devices 212 using the patterned tungsten layer 228 as a mask (and optionally also using the features 232 and filler features 254 as a mask if they are retained). The oxide features 232 and filler features 254 may be removed after the etching step in FIG. 11h. The upper electrodes 26 are then formed on the memory cell array 210 as shown in FIGS. 1 and 2.

Formation of a first memory level has been described. Additional memory levels can be formed above this first memory level to form a monolithic three dimensional memory array. In some embodiments, conductors can be shared between memory levels; i.e. top conductor would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A method of making a pillar shaped nonvolatile memory device array, comprising:
    forming a plurality of bottom electrodes over a substrate;
    forming at least one semiconductor device layer over the plurality of bottom electrodes;
    forming a plurality of spaced apart features over the at least one semiconductor device layer;
    providing alignment edge features adjacent to a device array boundary, wherein the alignment edge features have a larger size than the plurality of spaced apart features;
    forming sidewall spacers on the plurality of spaced apart features;
    forming a filler film over and between the plurality of spaced apart features;
    planarizing the filler film to expose upper portions of the plurality of spaced apart features and upper portions of the sidewall spacers to leave a plurality of filler features located between the sidewall spacers;
    forming a photoresist layer over the plurality of filler features and over the plurality of spaced apart features;
    exposing the photoresist layer using the alignment edge features during alignment;
    patterning the exposed photoresist layer to form a photoresist pattern covering a device array area;
    etching the filler film in areas outside of the device array boundary that are not covered by the photoresist pattern to remove the filler film from areas outside of the device array boundary;
    selectively removing the sidewall spacers to leave the plurality of spaced apart features and the plurality of filler features spaced apart from each other;
    etching the at least one semiconductor device layer using the plurality of spaced apart features and the plurality of filler features as a mask to form a plurality of pillar shaped diode containing nonvolatile memory cells; and
    forming a plurality of upper electrodes contacting the plurality of nonvolatile memory cells.

2. The method of claim 1, wherein:
    the plurality of spaced apart features and the plurality of filler features comprise a first material and the sidewall spacers comprise a second material different from the first material; and
    the step of selectively removing comprises selectively etching the second material of the sidewall spacers without substantially removing the first material.

3. The method of claim 1, wherein:
    the plurality of spaced apart features comprise a first material, and the plurality of filler features comprise a second material and the sidewall spacers comprise a third material different from the first and the second material; and
    the step of selectively removing comprises selectively etching the third material of the sidewall spacers without substantially removing the first or the second material.

4. The method of claim 1, wherein:
    the plurality of spaced apart features comprise tungsten covered by a silicon nitride or titanium nitride hard mask material;
    the plurality of filler features comprise tungsten; and
    the sidewall spacers comprise silicon oxide.

5. The method of claim 4, wherein the plurality of spaced apart features comprise at least a portion of the upper electrodes.

6. The method of claim 1, wherein:
    the plurality of spaced apart features comprise silicon oxide;
    the plurality of filler features comprise silicon oxide; and
    the sidewall spacers comprise silicon nitride.

7. The method of claim 6, further comprises removing the plurality of spaced apart features and the plurality of filler features after the step of etching the at least one semiconductor device layer.

8. The method of claim 1, wherein each of the plurality of spaced apart features has a substantially cylindrical shape and each of the plurality of filler features has a substantially rectangular or square shape with concave sidewalls.

9. The method of claim 1, wherein the step of forming sidewall spacers comprises forming the sidewall spacers on the plurality of features, such that the sidewalls spacers on adjacent features along at least two predetermined directions contact each other to form fully enclosed interstitial spaces located between the sidewall spacers.

* * * * *